US007675343B2

(12) United States Patent
Kwon

(10) Patent No.: US 7,675,343 B2
(45) Date of Patent: Mar. 9, 2010

(54) LEVEL SHIFTER AND DISPLAY DEVICE USING THE SAME

(75) Inventor: Oh-Kyong Kwon, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 869 days.

(21) Appl. No.: 11/226,816

(22) Filed: Sep. 13, 2005

(65) Prior Publication Data

US 2006/0077166 A1 Apr. 13, 2006

(30) Foreign Application Priority Data

Oct. 8, 2004 (KR) ...................... 10-2004-0080375

(51) Int. Cl.
*H03L 5/00* (2006.01)

(52) U.S. Cl. ......................... 327/333; 345/98; 345/204; 345/211; 345/212

(58) Field of Classification Search ........... 345/98-100, 345/204, 211-213; 327/333
See application file for complete search history.

(56) References Cited

U.S. PATENT DOCUMENTS 6,788,277 B2 * 9/2004 Kanauchi et al. .............. 345/77
2004/0041614 A1 * 3/2004 Tobita ........................ 327/333
2005/0285658 A1 * 12/2005 Schulmeyer et al. ........ 327/333
2006/0044888 A1 * 3/2006 Kim et al. .............. 365/189.11

FOREIGN PATENT DOCUMENTS

JP 2002-353806 12/2002
KR 2001-0015346 2/2001

OTHER PUBLICATIONS

Patent Abstracts of Japan, Publication No. 2002-353806; Date of Publication: Dec. 6, 2002; in the name of Yosuke Sakurai.
Korean Patent Abstracts, Publication No. 1020010015346; Date of Publication: Feb. 26, 2001; in the name of Osamu Sasaki et al.

* cited by examiner

*Primary Examiner*—Richard Hjerpe
*Assistant Examiner*—Gregory J Tryder
(74) *Attorney, Agent, or Firm*—Christie, Parker & Hale, LLP

(57) ABSTRACT

A level shifter includes: a first transistor including a first electrode coupled to a first power source, a second electrode coupled to a first output terminal, and a control electrode coupled to a second output terminal; a second transistor including a first electrode coupled to the first power source, a second electrode coupled to the second output terminal, and a control electrode coupled to the first output terminal; a third transistor including a first electrode, and a second electrode coupled to the second output terminal; a fourth transistor including a first electrode, and a second electrode coupled to the first output terminal; a first capacitor including a first terminal and a second terminal; and a second capacitor including a first terminal and a second terminal.

10 Claims, 5 Drawing Sheets

LEVEL SHIFTER AND DISPLAY DEVICE USING THE SAME

CROSS-REFERENCE TO RELATED APPLICATION

This application claims priority to and the benefit of Korean Patent Application No. 10-2004-0080375 filed in the Korean Intellectual Property Office on Oct. 8, 2004, the entire content of which is incorporated herein by reference.

FIELD OF THE INVENTION

The present invention relates to a level shifter. More particularly, the present invention relates to a level shifter operating at high speed and a display device using the same.

BACKGROUND OF THE INVENTION

In general, a level shifter is used for shifting a predetermined voltage level of an input signal into another voltage level. That is, a level shifter supplies a low voltage level signal to a high voltage level signal by shifting a low voltage level input signal into a high voltage level output signal. Alternatively, a level shifter may supply a high voltage level signal to a low voltage level signal by shifting a high voltage level input signal into a low voltage level output signal.

FIG. 1 shows a diagram of a configuration of a conventional level shift circuit.

As shown in FIG. 1, the level shift circuit is a cross-coupled circuit, and includes two p-type transistors P1 and P2, and two n-type transistors N1 and N2.

When a high level input signal in1 is inputted to the gate of transistor N1 and a low level input signal in2 is inputted to the gate of transistor N2, node A becomes a reference potential (e.g., a ground potential) because the transistor N1 is turned on and the transistor N2 is turned off. When node A becomes ground potential, transistor P2 is turned on because the ground potential is applied to the gate of transistor P2, and an output signal out2 of a supply voltage VDDH is outputted because the supply voltage VDDH is supplied to a node B.

In addition, when a low level input signal in1 is inputted to the gate of transistor N1 and a high level input signal in2 is inputted to the gate of transistor N2, node B becomes the reference potential (e.g., a ground potential) because transistor N1 is turned off and transistor N2 is turned on. When node B becomes the ground potential, transistor P1 is turned on because the ground potential is applied to the gate of transistor P1, and an output signal out1 of the supply voltage VDDH is outputted because the supply voltage is supplied to node A.

Such a conventional level shifter uses n-type transistors N1 and N2 as driving transistors. However, an n-type transistor has a higher threshold voltage and less mobility compared to a p-type transistor. For example, in the level shifter shown in FIG. 1, when a threshold voltage of the n-type transistors N1 and N2 is close to a voltage of the input signals in1 and in2, the n-type transistors N1 and N2 are weakly turned on. For example, when the threshold voltage of the n-type transistors N1 and N2 is 3V and the voltage of the input signal is 3.3V, Vgs−Vth of the n-type transistors N1 and N2 is only 0.3V, where Vgs denotes a voltage between the gate and the source of a transistor, and Vth denotes a threshold voltage. Therefore, in this case, the operation of the n-type transistor is unstable and its operating speed is slow because the n-type transistor is weakly turned on. Accordingly, it is difficult to apply the n-type transistor to a display device operating at a high speed.

Specifically, the level shifter may be integrated on a glass substrate of a display panel by forming the level shifting by a thin film transistor (TFT) using a low temperature polysilicon (LTPS). The LTPS TFT has less mobility and a higher threshold voltage compared to a metal oxide semiconductor (MOS) transistor using single crystalline silicon. Accordingly, a level shifter using LTPS TFT has difficulty achieving a high operating speed and therefore it is difficult to apply such to a display device operating at a high speed. Even if the operating speed is accelerated by increasing the voltage of the input signal, the level shifter using LTPS TFT is difficult to be applied to a display device, which requires low power consumption, since power consumption is increased by increasing the voltage of the input signal.

The information disclosed in this Background of the Invention section is only for enhancement of understanding of the background of the invention and therefore, unless explicitly described to the contrary, it should not be taken as an acknowledgement or any form of suggestion that this information forms the prior art that is already known in this country to a person of ordinary skill in the art.

SUMMARY OF THE INVENTION

An exemplary level shifter according to an embodiment of the present invention includes a first transistor, a second transistor, a third transistor, a fourth transistor, a first capacitor, and a second capacitor. The first transistor including a first electrode coupled to a first power source for supplying a first voltage, a second electrode coupled to a first output terminal, and a control electrode coupled to a second output terminal. The second transistor including a first electrode coupled to the first power, a second electrode coupled to the second output terminal, and a control electrode coupled to the first output terminal. The third transistor including a first electrode receiving a first input signal, and a second electrode coupled to the second output terminal. The fourth transistor including a first electrode receiving a second input signal which is an inverted signal of the first input signal, and a second electrode coupled to the first output terminal. The first capacitor including a first terminal coupled to a control electrode of the fourth transistor, and a second terminal receiving the first input signal. The second capacitor including a first terminal coupled to a control electrode of the third transistor, and a second terminal receiving the second input signal.

The first and second capacitors may be charged with a predetermined voltage during operation of the level shifter.

In one embodiment, the level shifter further includes a fifth transistor, and a sixth transistor. The fifth transistor including a control electrode coupled to the second terminal of the first capacitor, the fifth transistor being coupled between the fourth transistor and a second power source for supplying a voltage corresponding to a predetermined voltage. The sixth transistor including a control electrode coupled to the second terminal of the second capacitor, the sixth transistor being coupled between the third transistor and the second power source. The fifth and sixth transistors may be of the same type as the first and second transistors.

The first, second, third, and fourth transistors may be polysilicon thin film transistors. The third and fourth transistors may be of a different type from the first and second transistors, or the third and fourth transistors may be n-channel transistors. A first level of the first and second input signals may be a low voltage level, and a second level of the same may be a high voltage level. The voltage corresponding to the predetermined voltage may be of a same level with the second level of the first and second input signals.

In one embodiment, the level shifter includes a first transistor, a second transistor, a first capacitor, and a third transistor. The first transistor including a first electrode coupled to a first power source for supplying a first voltage, a second electrode coupled to a first output terminal, and a control electrode coupled to a second output terminal. The second transistor including a first electrode receiving a first input signal, and a second electrode coupled to the first output terminal. The first capacitor including a first terminal coupled to a control electrode of the second transistor, and a second terminal receiving a second input signal which is an inverted signal of the first input signal. The third transistor including a control electrode receiving the second input signal, a first electrode receiving a predetermined voltage, and a second electrode coupled to the first terminal of the first capacitor.

A first level of the first input signal may be a low voltage level, a second level may be a high voltage level, and the predetermined voltage may have the same voltage level as the second level of the first input signal.

In one embodiment, the level shifter further includes a fourth transistor, a fifth transistor, a second capacitor, and a sixth transistor. The fourth transistor includes a first electrode coupled to the first power source, a second electrode coupled to a second output terminal, and a control electrode receiving an inverted signal of a signal applied to the second output terminal. The fifth transistor includes a first electrode receiving the second input signal, and a second electrode coupled to the second output terminal. The second capacitor includes a first terminal coupled to the control electrode of the fifth transistor, and a second terminal coupled to the first input signal. The sixth transistor includes a control electrode receiving the first input signal, a first electrode receiving a predetermined voltage, and a second electrode coupled to the first terminal of the second capacitor.

The control electrode of the first transistor may be coupled to the second output terminal, and the control electrode of the fourth transistor may be coupled to the first output terminal.

The second and fifth transistors may be of a different type from the first, third, fourth, and sixth transistors and the second and fifth transistors may be n-channel transistors.

In one embodiment, the present invention is a method for driving a level shifter including applying a first level of a first input signal to a first electrode of a first transistor and applying a voltage corresponding to a sum of a second level of the first input signal and a predetermined voltage level to control electrode of the first transistor, and applying a second level of the first input signal to the first electrode of the first transistor and applying a voltage corresponding to a sum of the first level and the predetermined voltage level to the control electrode of the first transistor.

In one embodiment, the first transistor is an n-channel transistor, the second transistor is a p-channel transistor, the first level is a low voltage level and the second level is a high voltage level.

DETAILED DESCRIPTION

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

Figure 1:
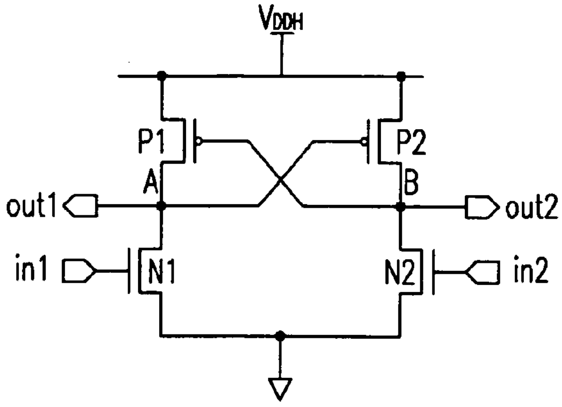
FIG.1(Prior Art)
FIG. 1 shows a diagram of a configuration of a conventional level shift circuit.
Figure 2:
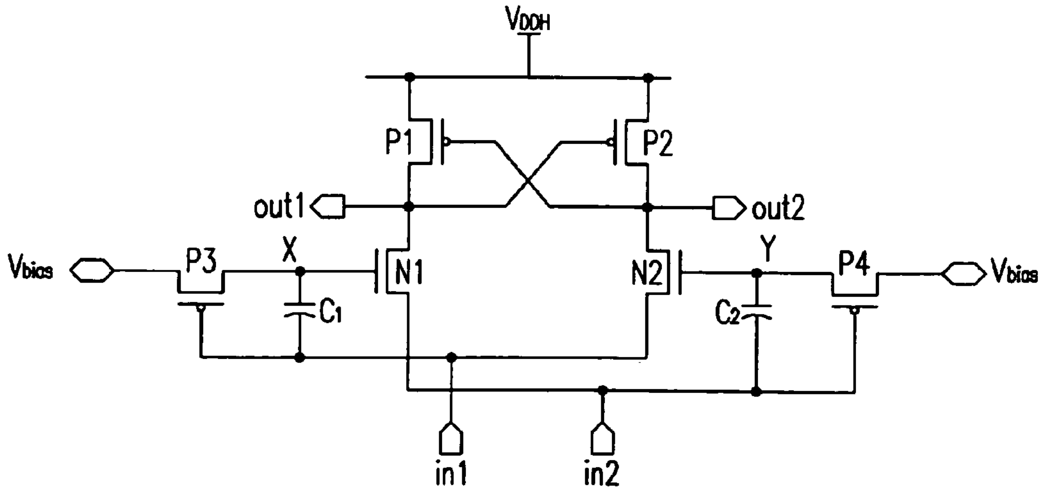
FIG. 2 shows a diagram of a configuration of a level shift circuit according to an embodiment of the present invention.

FIG. 2 shows a diagram of a configuration of a level shifter circuit according to the embodiment of the present invention. As shown in FIG. 2, the level shifter circuit includes four p-type transistors P1, P2, P3, and P4, two n-type driving transistors N1 and N2, and two capacitors C1 and C2.

A source of the transistor P1 is coupled to a power source VDDH, a gate of the transistor P1 is coupled to a drain of the transistor P2 and an output terminal out2, and a drain of the transistor P1 is coupled to an output terminal out1 and a gate of the transistor P2. Accordingly, the transistors P1 and P2 are cross-coupled to each other. An input signal in2 is applied to a source of the transistor N1, and an input signal in1 is applied to a source of the transistor N2. The input signal in1 is also applied to a first terminal of the capacitor C1 and a gate of the transistor P3. The input signal in2 is applied to a first terminal of the capacitor C2 and a gate of the transistor P4. A second power source Vbias is supplied to a source of the transistor P3, and the first terminal of the capacitor C1 is coupled to the gate of the transistor P3. A drain of the transistor P3, a second terminal of the capacitor C1, and a gate of the transistor N1 together form a node X. The second power source Vbias is supplied to a source of the transistor P4, and the first terminal of the capacitor C2 is coupled to the gate of the transistor P4. A drain of the transistor P4, a second terminal of the capacitor C2, and a gate of the transistor N2 together form a node Y.

Figure 3:
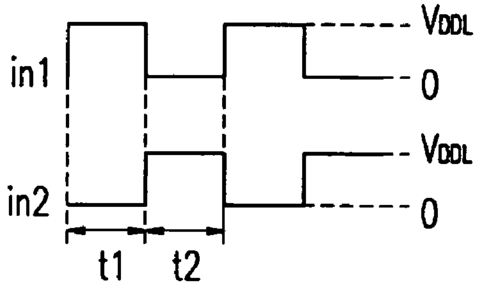
FIG. 3 shows a diagram for representing waveforms of input signals applied to a level shifter according to a first embodiment of the present invention.

The operation of the level shift circuit is now described with reference to FIG. 3. FIG. 3 shows a diagram for representing waveforms of input signals in1 and in2 applied to the level shifter according to a first embodiment of the present invention.

Before operating the level shifter, it is assumed that the capacitors C1 and C2 are charged to the voltage Vbias since both transistors P3 and P4 would be turned on if the input signals in1 and in2 were both at a low level. In addition, the input signals in1 and in2 are complementary digital signals, and have a high level voltage VDDL and a low level voltage. It is also assumed that the high level voltage VDDL is lower than the power source voltage VDDH and the low level voltage is a ground voltage. It is also assumed that the charged voltage Vbias of the capacitors C1 and C2 is equal to the high level voltage VDDL. Accordingly, even if the voltage Vbias is applied to the gate of the transistors N1 and N2, the level shifter may not operate normally because the transistors N1 and N2 remain turned off or weakly turned on.

As shown in FIG. 3, for a time t1, when the input signal in1 is at a high level VDDL and the input signal in2 is at a low level 0, the voltage at node Y remains at Vbias and the voltage at node X is increased to a voltage of Vx. The voltage Vx is as shown in Equation 1.

$$V_X = V_{bias} + \Delta V$$

$$\Delta V = V_{DDL} - V_p \quad \text{[Equation 1]},$$

where ΔV denotes an amplitude of a voltage increased by applying an input voltage VDDL, and Vp denotes a sum of voltages stored in a parasitic capacitor between the transistor P3 and the node X and a parasitic capacitor between the transistor N1 and the node X.

The voltage ΔV may not be increased to the voltage Vbias due to adjacent parasitic components such as the parasitic capacitors between the transistor P3 and the node X, and between the transistor N1 and the node X. Even if capacitance of the capacitors C1 and C2 is large, the voltage ΔV may not reach the voltage Vbias.

When the voltage at the node X is increased to the voltage VX, the voltage difference between the gate and the source of the transistor N1 is increased because a gate voltage of the transistor N1 is the voltage VX and a source voltage of the transistor N1 is the low level input signal in2. Therefore, the transistor N1 is turned on.

Accordingly, a voltage at the output terminal out1 remains at the low level voltage (0V) because a voltage at the output terminal out1 is reduced to the low level, the transistor P2 is turned on, a voltage at the output terminal out2 is at the high voltage VDDH, the transistor P1 is turned off, and the transistor N1 is turned on. That is, the level shifter operates normally because the voltage VX is applied to the gate of the transistor N1, even if the high level VDDL of the input signal in1 is similar to a threshold voltage of the transistor N1.

For a time t2, when the input signal in1 is at the low level and the input signal in2 is at the high level, the voltage at the node X is the voltage Vbias. Accordingly, the transistor N1 is turned off because the voltage difference between the source and the gate is zero since the gate voltage of the transistor N1 becomes the voltage Vbias and the source voltage of the transistor N1 becomes the high level VDDL (as assumed above, VDDL=Vbias). Further, the transistor N2 is turned on because a voltage at the node Y is increased to the voltage Vx as shown in Equation 1. Accordingly, the voltage at the output terminal out2 is reduced to the low level, the transistor P1 is turned on, the voltage at the output terminal out1 becomes the high level voltage VDDH, the transistor P2 is turned off, and the voltage of the output terminal out2 remains at the low level.

Figure 4:
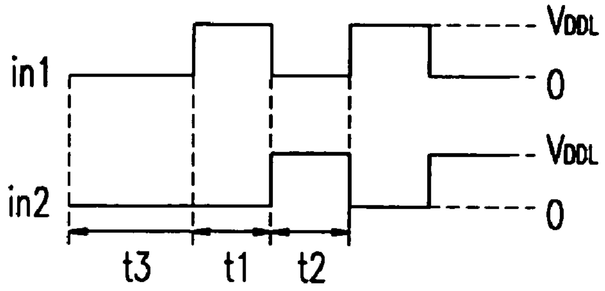
FIG. 4 shows a diagram for representing waveforms of input signals applied to a level shifter according to a second embodiment of the present invention.

FIG. 4 shows a diagram representing waveforms of the input signals in1 and in2 applied to a level shifter according to a second embodiment of the present invention. In the second embodiment of the present invention, an initialization time t3 is provided before the input signal is applied, which is different from the first embodiment of the present invention.

In the level shift circuit shown in FIG. 2, when a voltage level of an initial input signal becomes the high level without charging the capacitors C1 and C2 for an initial setting period, voltages at the second terminals of the capacitors C1 and C2 may become an arbitrary voltage rather than the voltage Vbias. When the voltage level of the input signal becomes the low level for a subsequent period, the voltages at the second terminals of the capacitors C1 and C2 may become the voltage Vbias because the transistors P3 and P4 are turned on. As described, an output according to the initial signal may not be performed accurately, without the initialization time t3. Accordingly, as shown in FIG. 4, the transistors P3 and P4 may be turned on and the capacitors C1 and C2 may be previously charged with the voltage Vbias for the time t3 by applying the low level input signals in1 and in2 for the time t3 prior to the operation times t1 and t2. Therefore, the output according to the initial input signal may be performed normally.

Figure 5:
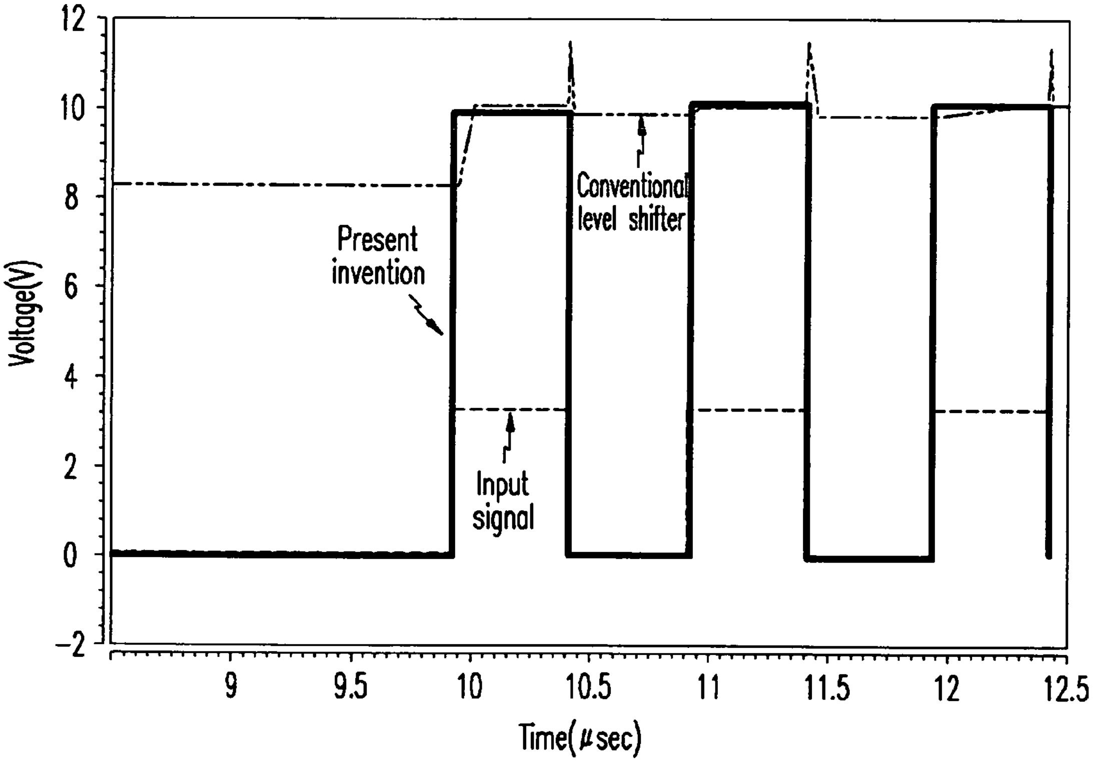
FIG. 5 and FIG. 6 respectively show graphs for comparing performance between a conventional level shifter and a level shifter according to an embodiment of the present invention.
Figure 6:
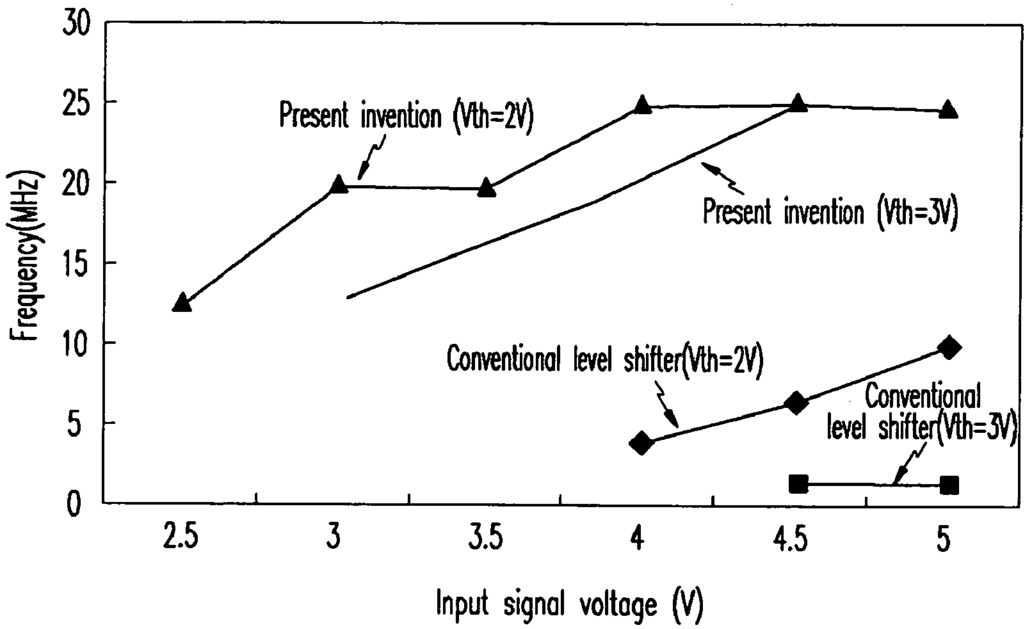

FIG. 5 and FIG. 6 respectively show graphs for comparing performance between a conventional level shifter and the level shifter of the present invention.

FIG. 5 shows output waveforms when the voltage level of the input signal is 3.3V and the threshold voltages of the n-type and p-type transistors are 3V. In FIG. 5, the input signal is illustrated as a broken line, the output signal of the conventional level shifter is illustrated as a chain double-dashed line, and the output signal of the level shifter according to the embodiment of the present invention is illustrated as a solid line.

As shown in FIGS. 5 and 6, the conventional level shifter has less mobility since the difference between the input signal and a threshold voltage of a transistor is only 0.3V. Accordingly, there has been a problem in that a waveform of the output signal does not correspond to the input signal because the conventional level shifter can not operate normally even if the transistor is turned on since the voltage difference is low. However, the output signal of the level shifter according to the embodiment of the present invention has a voltage of approximately 10 V corresponding to a 3V input signal after a predetermined initialization time.

FIG. 6 shows a graph for comparing operation speeds according to input voltages of a conventional level shifter and the level shifter according to an exemplary embodiment of the present invention when threshold voltages of n-type and p-type transistors are 2V and 3V, respectively.

As shown in FIG. 6, even when the threshold voltage of the n-type and p-type transistors is 2V and a voltage level of the input signal is 2.5V, the level shifter according to the exemplary embodiment of the present invention shows an approximately 12 MHz operation speed. In a case that the voltage level of the input signal is 4V, the level shifter according to the exemplary embodiment of the present invention shows an approximately 25 MHz operation speed when the threshold voltage of the n-type and p-type transistors is 2V, and shows a 20 MHz operation speed when the threshold voltage of the n-type and p-type transistors is 3V. However, in a case that the voltage level of the input signal is 4V, the conventional level shifter shows an approximately 5 MHz operation speed when the threshold voltage of the n-type and p-type transistors is 2V, and does not operate when the threshold voltage of the n-type and p-type transistors is 3V.

As described, the level shifter according to the exemplary embodiments of the present invention is capable of operating at high speed with a high threshold voltage of the transistor and a low voltage level of the input signal. Accordingly, the level shifter according to the exemplary embodiments of the present invention may appropriately be used for a display device.

Figure 7:
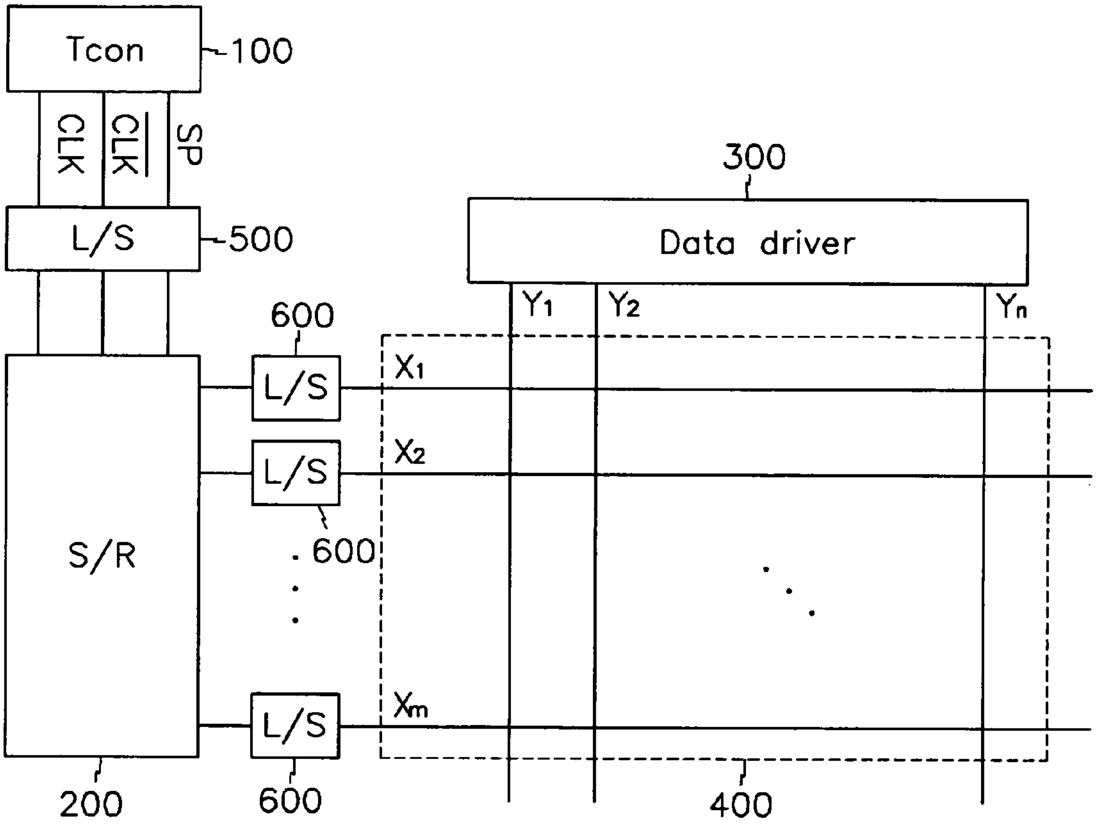
FIG. 7 shows a diagram of a configuration of a display device using a level shifter according to an embodiment of the present invention.

FIG. 7 shows a diagram of a configuration of a display device using the level shifter according to one embodiment of the present invention. The display device shown in FIG. 7 includes a timing controller Tcon 100, a shift register S/R 200, a data driver 300, and a display panel 400. The timing controller 100 generates timing signals CLK, /CLK, and SP for driving the shift register 200 and the data driver 300. The shift register 200 sequentially applies scan signals to scan lines X1 to Xm formed on the display panel 400, after receiving the timing signal from the timing controller 100. The data driver 300 applies data signal to data lines Y1 to Yn on the display panel 400 according to the timing signals.

For example, assuming that the voltage ranges used in the timing controller 100 and the shift register 200 are different from each other, an output voltage range of the timing controller 100 may be changed into a voltage range used in the shift register 200 by coupling a level shifter L/S 500 according to an embodiment of the present invention between each of the signals of the timing controller 100 and the shift register 200.

In a like manner, assuming that the voltage ranges used in the shift register 200 and the display panel 400 are different from each other, an output voltage range of the shift register 200 may be changed into a voltage range used in the display panel 400 by coupling a level shifter L/S 600 according to the exemplary embodiments of the present invention between the shift register 200 and each of the scan lines X1-Xm on the display panel 400. In this case, a buffer (not shown) operating within a voltage range used in the display panel 400 may be coupled between the level shifter 600 and the display panel 400.

While the present invention has been described in connection with a level shifter used between the timing controller 100 and the shift register 200 and a level shifter used between the shift register 200 and the display panel 400, the present invention is not limited to the disclosed embodiments. On the contrary, the present invention is intended to cover various modifications provided that a voltage range is changed in a display device.

The level shifter according to the present invention increases a gate-source voltage by increasing a gate voltage by using a voltage of an input signal and a capacitor charged with a bias voltage so as to turn on a driving transistor of a level shifter having a higher threshold voltage. Accordingly, the driving transistor may operate at a high speed even when the threshold voltage of the driving transistor reaches close to a high level voltage of the input signal. In addition, the number of power sources may be reduced by equalizing an amplitude of the bias voltage applied for charging the capacitor with the high level voltage.

Therefore, the level shifter according to the exemplary embodiment of the present invention may operate when the input voltage is lower and the threshold voltage is higher, and be used with a wide range of threshold voltages. A display device using the level shifter may further reduce power consumption by using the low voltage level input signal.

More specifically, the operation speed of the level shifter according to the embodiments of the present invention is high enough to use the level shifter as a peripheral circuit even if the LTPS TFT having a higher threshold voltage is used.

While this invention has been described in connection with what are presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A level shifter comprising:

a first transistor comprising a first electrode coupled to a first power source for supplying a first voltage, a second electrode coupled to a first output terminal, and a control electrode coupled to a second output terminal;

a second transistor comprising a first electrode coupled to the first power source, a second electrode coupled to the second output terminal, and a control electrode coupled to the first output terminal;

a third transistor comprising a first electrode receiving a first input signal, and a second electrode coupled to the second output terminal;

a fourth transistor comprising a first electrode receiving a second input signal that is an inverted signal of the first input signal, and a second electrode coupled to the first output terminal;

a first capacitor comprising a first terminal coupled to a control electrode of the fourth transistor at a node X, and a second terminal receiving the first input signal;

a second capacitor comprising a first terminal coupled to a control electrode of the third transistor at a node Y, and a second terminal receiving the second input signal;

a fifth transistor comprising a control electrode directly coupled to the second terminal of the first capacitor and the first input signal, a first electrode coupled to the control electrode of the fourth transistor and the first terminal of the first capacitor at said node X, and a second electrode coupled to a second power source for supplying a voltage corresponding to a predetermined voltage; and a sixth transistor comprising a control electrode directly coupled to the second terminal of the second capacitor and the second input signal, a first electrode coupled to the control electrode of the third transistor and the first terminal of the second capacitor at said node Y, and a second electrode coupled to the second power source, wherein the fifth transistor is configured to apply a voltage corresponding to a sum of substantially the first input signal voltage and the predetermined voltage to said node X, when turned on by the first input signal, and wherein the sixth transistor is configured to apply a voltage corresponding to a sum of substantially the second input signal voltage and the predetermined voltage to said node Y, when turned on by the second input signal.

2. The level shifter of claim 1, wherein the first and second capacitors are charged with a predetermined voltage during operation of the level shifter.

3. The level shifter of claim 1, wherein the fifth and sixth transistors are of the same type as the first and second transistors.

4. The level shifter of claim 3, wherein the first, second, third, and fourth transistors are polysilicon thin film transistors.

5. The level shifter of claim 4, wherein the third and fourth transistors are of a different type from the first and second transistors.

6. The level shifter of claim 5, wherein the third and fourth transistors are n-channel transistors.

7. The level shifter of claim 6, wherein a first level of the first and second input signals is a low voltage level, and a second level of the first and second input signals is a high voltage level.

8. The level shifter of claim 7, wherein the voltage corresponding to the predetermined voltage is of the same level as the second level of the first and second input signals.

9. A display device comprising a level shifter wherein the level shifter comprises:

a first transistor comprising a first electrode coupled to a first power source for supplying a first voltage, a second electrode coupled to a first output terminal, and a control electrode coupled to a second output terminal;

a second transistor comprising a first electrode coupled to the first power source, a second electrode coupled to the second output terminal, and a control electrode coupled to the first output terminal;

a third transistor comprising a first electrode receiving a first input signal, and a second electrode coupled to the second output terminal;

a fourth transistor comprising a first electrode receiving a second input signal that is an inverted signal of the first input signal, and a second electrode coupled to the first output terminal;

a first capacitor comprising a first terminal coupled to a control electrode of the fourth transistor at a node X, and a second terminal receiving the first input signal;

a second capacitor comprising a first terminal coupled to a control electrode of the third transistor at a node Y, and a second terminal receiving the second input signal;

a fifth transistor comprising a control electrode directly coupled to the second terminal of the first capacitor and the first input signal, a first electrode coupled to the control electrode of the fourth transistor and the first terminal of the first capacitor at said node X, and a second electrode coupled to a second power source for supplying a voltage corresponding to a predetermined voltage; and a sixth transistor comprising a control electrode directly coupled to the second terminal of the second capacitor and the second input signal, a first electrode coupled to the control electrode of the third transistor and the first terminal of the second capacitor at said node Y, and a second electrode coupled to the second power source, wherein the fifth transistor is configured to apply a voltage higher than the predetermined voltage to node said X, when turned on by the first input signal, and wherein the sixth transistor is configured to apply a voltage higher than the predetermined voltage to said node Y, when turned on by the second input signal.

10. The display device of claim 9 further comprising;

a display panel;

a timing controller for generating timing signals;

a shift register for sequentially applying a plurality of scan signals to respective scan lines on the display panel; and a data driver for applying a plurality of data signals to respective data lines on the display panel.

* * * * *